United States Patent
Beers et al.

(10) Patent No.: US 7,361,302 B2
(45) Date of Patent: *Apr. 22, 2008

(54) OXIDATION AND FATIGUE RESISTANT METALLIC COATING

(75) Inventors: Russell Albert Beers, Manchester, CT (US); Allan A. Noetzel, Irving, TX (US); Abdus Khan, Ennetbaden (CH)

(73) Assignee: United Technologies Corporation, Hartford, CT (US)

( * ) Notice: Subject to any disclaimer, the term of this patent is extended or adjusted under 35 U.S.C. 154(b) by 158 days.

This patent is subject to a terminal disclaimer.

(21) Appl. No.: 10/940,233

(22) Filed: Sep. 13, 2004

(65) Prior Publication Data

US 2005/0106332 A1    May 19, 2005

Related U.S. Application Data

(63) Continuation of application No. 10/141,684, filed on May 7, 2002, now Pat. No. 6,919,042.

(51) Int. Cl.
*B32B 15/20* (2006.01)
*C22C 19/05* (2006.01)
*B05D 1/02* (2006.01)
*C23C 4/06* (2006.01)
*C23C 14/14* (2006.01)

(52) U.S. Cl. .................. 420/445; 420/460; 427/576; 427/578; 427/456; 428/680; 148/428; 204/192.15

(58) Field of Classification Search ............. 420/441, 420/442, 445, 447, 448, 450, 453, 460; 148/426, 148/427, 428, 429; 428/680; 416/241 B, 416/241 R; 427/569, 576, 578, 446, 445, 427/456; 204/192.1, 192.12, 192.15
See application file for complete search history.

(56) References Cited

U.S. PATENT DOCUMENTS

| | | | | |
|---|---|---|---|---|
| 4,116,723 A | * | 9/1978 | Gell et al. ............... | 148/555 |
| 5,043,138 A | * | 8/1991 | Darolia et al. .......... | 420/443 |
| 5,077,141 A | * | 12/1991 | Naik et al. .............. | 428/680 |
| 5,316,866 A | * | 5/1994 | Goldman et al. ........ | 428/621 |
| 6,054,096 A | * | 4/2000 | Duhl et al. .............. | 420/448 |
| 6,919,042 B2 | * | 7/2005 | Beers et al. ............. | 420/441 |

FOREIGN PATENT DOCUMENTS

| | | |
|---|---|---|
| EP | 0194391 | 9/1986 |
| JP | 62-30037 | 2/1987 |
| JP | 5-132751 | 5/1993 |

* cited by examiner

*Primary Examiner*—Michael E. LaVilla
(74) *Attorney, Agent, or Firm*—Bachman & LaPointe

(57) ABSTRACT

The present invention relates to a metallic coating to be deposited on gas turbine engine components. The metallic coating comprises up to 18 wt % cobalt, 3.0 to 18 wt % chromium, 5.0 to 15 wt % aluminum, 0.1 to 1.0 wt % yttrium, up to 0.6 wt % hafnium, up to 0.3 wt % silicon, 3.0 to 10 wt % tantalum, up to 9.0 wt % tungsten, 1.0 to 6.0 wt % rhenium, up to 10 wt % molybdenum, and the balance nickel.

38 Claims, No Drawings

OXIDATION AND FATIGUE RESISTANT METALLIC COATING

CROSS-REFERENCE TO RELATED APPLICATION(S)

This application is a continuation application of U.S. patent application Ser. No. 10/141,684, filed May 7, 2002, now U.S. Pat. No. 6,919,042, entitled OXIDATION AND FATIGUE RESISTANT METALLIC COATINGS, By Russell Albert Beers et al.

BACKGROUND OF THE INVENTION

The present invention relates to an oxidation and fatigue resistant metallic coating for protecting high temperature gas turbine engine components.

Various metallic coatings have been developed in the past for the oxidation protection of high temperature gas turbine engine components. These coatings are often based on different aluminide compositions with nickel or cobalt base metal materials. Alternatively, they are based on overlay deposits with MCrAlY foundations where M is nickel, cobalt, iron or combinations of these materials. These coating systems suffer from shortcomings that preclude their use on newer advanced turbine components. The diffused aluminides, while possessing good fatigue resistance, are generally lacking in very high temperature oxidation resistance (above 2000 degrees Fahrenheit). The overlay MCrAlY coatings tend to have serious fatigue debts that limit their applications. The addition of active elements to the MCrAlY coatings not only provides excellent oxidation resistance, but makes them good candidates for bond-coats for thermal barrier ceramic coatings. While both aluminides and MCrAlY coatings have widespread applications, a new coating that could combine the best properties from both would have immediate application on advanced turbine components where fatigue, pull weight, and oxidation must all be minimized.

SUMMARY OF THE INVENTION

Accordingly, it is an object of the present invention to provide a metallic coating composition which provides excellent oxidation and fatigue resistance properties.

It is another object of the present invention to provide a coating composition which reduces the thermal expansion mismatch between the coating and common turbine alloys.

The foregoing objects are attained by the coatings of the present invention.

In accordance with the present invention, a metallic coating is provided which has a composition comprising up to 18 wt % cobalt, 3.0 to 18 wt % chromium, 5.0 to 15 wt % aluminum, 0.1 to 1.0 wt % yttrium, up to 0.6 wt % hafnium, up to 0.3 wt % silicon, 3.0 to 10 wt % tantalum, up to 9.0 wt % tungsten, 1.0 to 6.0 wt % rhenium, up to 10 wt % molybdenum, and the balance nickel. The coating compositions of the present invention also have a total amount of tantalum and tungsten in the range of 3.0 to 16 wt %.

Other details of the oxidation and fatigue resistant metallic coatings of the present invention, as well as other objects and advantages attendant thereto, are set forth in the following detailed description.

DETAILED DESCRIPTION OF THE PREFERRED EMBODIMENT(S)

Turbine engine components are formed from nickel-based, cobalt-based, and iron-based alloys. Due to the extreme high temperature environments in which these components work, it is necessary to provide them with a protective coating. The coatings must have a composition which minimizes the fatigue impact on the turbine engine components to which they are applied and at the same time provide maximum oxidation resistance properties. The coating must also be one where the thermal expansion mismatch between the coating and the alloy(s) used to form the turbine engine components is minimized. This mismatch is one of the causes of the poor fatigue performance of MCrAlY coatings.

In accordance with the present invention, metallic coatings have been developed which reduce the thermal mismatch and which provide a very desirable oxidation and fatigue resistance. These metallic coatings having a composition which broadly consists essentially of from up to 18 wt % cobalt, 3.0 to 18 wt % chromium, 5.0 to 15 wt % aluminum, 0.1 to 1.0 wt % yttrium, up to 0.6 wt % hafnium, up to 0.3 wt % silicon, 3.0 to 10 wt % tantalum, up to 9.0 wt % tungsten, 1.0 to 6.0 wt % rhenium, up to 10 wt % molybdenum, and the balance nickel. In these coatings, the tungsten and the tantalum are present in a total amount in the range of from 3.0 to 16 wt %.

Within the foregoing broad coating compositions, a first family of particularly useful coatings for turbine engine components has a composition which consists essentially of up to 15 wt %, preferably 2.0 wt % or less, cobalt, 5.0 to 18 wt %, preferably 10 to 15 wt % chromium, 5.0 to 12 wt %, preferably 6.0 to 10 wt % aluminum, 0.1 to 1.0 wt %, preferably 0.2 to 0.7 wt %, yttrium, up to 0.6 wt %, preferably 0.2 to 0.6 wt %, hafnium, up to 0.3 wt %, preferably 0.1 wt % or less, silicon, 3.0 to 10 wt %, preferably, 5.0 to 7.0 wt % tantalum, up to 5.0 wt %, preferably, 1.0 to 4.0 wt % tungsten, 1.0 to 6.0, preferably 1.0 to 3.5 wt %, rhenium, up to 10 wt %, preferably 4.0 wt % or less, molybdenum, and the balance nickel. The total amount of tantalum and tungsten in these metallic coatings is in the range of 3.0 to 12 wt % and preferably, in the range of 5.0 to 9.0 wt %.

Within this first family of coatings, a particularly useful coating composition consists of 12.5 wt % chromium, 8.0 wt % aluminum, 0.4 to 0.7 wt % yttrium, 0.4 wt % hafnium, 6.0 wt % tantalum, 2.0 wt % tungsten, 2.0 wt % rhenium, and the balance nickel.

A second family of particularly useful metallic coating compositions comprises 2.0 to 18 wt %, preferably 8.0 to 12 wt %, cobalt, 3.0 to 10 wt %, preferably 4.0 to 6.5 wt %, chromium, 5.5 to 15 wt %, preferably 7.5 to 12.5 wt % aluminum, 0.1 to 1.0 wt %, preferably 0.2 to 0.7 wt %, yttrium, up to 0.6 wt %, preferably, from 0.2 to 0.6 wt %, hafnium, up to 0.3 wt % silicon, 3.0 to 10 wt %, preferably from 5.0 to 7.0 wt %, tantalum, 1.0 to 9.0 wt %, preferably 4.2 to 5.8 wt %, tungsten, 1.0 to 5.0 wt %, preferably 2.3 to 3.7 wt %, rhenium, 0.2 to 4.0 wt %, preferably 1.4 to 2.0 wt %, molybdenum, and the balance nickel. The total amount of tungsten and tantalum in these coatings is from 3.0 to 12 wt %, preferably from 5.0 to 9.0 wt %.

Within this second family of coatings, a particularly useful coating composition consists of 10.5 wt % cobalt, 5.0 wt % chromium, 9.0 wt % aluminum, 0.4 to 0.7 wt % yttrium, 0.4 wt % hafnium, 0.1 wt % silicon, 6.0 wt % tantalum, 5.0 wt % tungsten, 3.0 wt % rhenium, 1.7 wt % molybdenum, and the balance nickel.

A driver of poor coating fatigue performance is excessive coating thickness. Typical methods of depositing overlay coatings include thermal spray techniques such as low pressure plasma spray (LPSS), which creates coating thicknesses in the range of 0.004 to 0.012 inches. Using cathodic arc plasma vapor deposition techniques, it is possible to apply coatings with the aforesaid compositions having a thickness of 0.002 inches. Techniques for applying the coatings of the present invention by cathodic arc plasma vapor deposition are discussed in U.S. Pat. Nos. 5,972,185; 5,932,078; 6,036,828; 5,792,267; and 6,224,726, all of which are incorporated by reference herein. Alternate methods of deposition, including other plasma vapor deposition techniques such as magnetron sputtering and electron beam plasma vapor deposition may be used. When thickness concerns are not present, various thermal spray techniques such as low pressure plasma spray and HVOF (high velocity oxy-fuel) techniques may be utilized.

Coatings having compositions in accordance with the present invention have demonstrated thermal fatigue resistance equal to the best fatigue resistant diffused aluminide coating. The following table illustrates the results of a 2100 degree Fahrenheit burner rig cyclic oxidation test comparing compositions in accordance with the present invention with other coating compositions.

| Candidate # | Thickness | Coating Life (Hrs) | CL ** | System Failure (Hrs) | SF** |
|---|---|---|---|---|---|
| 701 | 2.95 | 2320 | 1573 | 2713 | 1839 |
| 702 | 3.1 | 4105 | 2648 | 6285 | 4055 |
| 703 | 2.7 | 1591 | 1179 | 1932 | 1431 |
| 699 | 3.3 | 3060 | 1855 | 3622 | 2195 |
| 700 | 2.15 | 1170 | 1088 | 1399 | 1301 |
| 697 | 2.4 | 982 | 818 | 1045 | 871 |
| 695 | 2.8 | 826 | 590 | 1315 | 939 |
| 696 | 2.45 | 676 | 552 | 805 | 657 |
| PWA275 | 2 | 115 | 115 | 366 | 366 |

2100 F. BURNER RIG CYCLIC OXIDATION TEST

** Normalized to a 2 mil coating thickness.

Samples formed from material 701 had a composition consisting of 12.5 wt % chromium, 8.0 wt % aluminum, 0.4 to 0.7 wt % yttrium, 0.4 wt % hafnium, 6.0 wt % tantalum, 2.0 wt % tungsten, 2.0 wt % rhenium, and the balance nickel. Samples formed from material 702 had a composition consisting of 10.5 wt % cobalt, 5.0 wt % chromium, 9.0 wt % aluminum, 0.4 to 0.7 wt % yttrium, 0.4 wt % hafnium, 0.1 wt % silicon, 6.0 wt % tantalum, 5.0 wt % tungsten, 3.0 wt % rhenium, 1.7 wt % molybdenum, and the balance nickel. Samples designated 703 had a composition of 7.0 wt % chromium, 6.0 wt % aluminum, 5,5 wt % tungsten, 4.0 wt % tantalum, 2.0 wt % rhenium, 4.0 wt % ruthenium, 0.5 wt % molybdenum, 0.4 wt % hafnium, 0.25 wt % yttrium, and the balance nickel.

Samples designated 699 are NiCoCrAlY compositions with rhenium and tantalum. Samples designated 700, 697, 695, and 696 are NiAl compositions with 2-4 wt % chromium, 0.2 to 0.6 wt % yttrium and 0.4 wt % hafnium. Samples designated PWA 275 are conventional low activity NiAl aluminides.

The test conditions were 57 minutes at 2100 degrees Fahrenheit and 3 minutes forced-air cooled, each hour. The burner rig used a supply of pre-heated, compressed air mixed with JP8 jet fuel to heat the samples in a dynamic environment.

It is apparent that there has been provided in accordance with the present invention an oxidation and fatigue resistant metallic coating which fully satisfies the objects, means and advantages set forth hereinbefore. While the present invention has been described in the context of specific embodiments thereof, other alternatives, modifications, and variations will become apparent to those skilled in the art having read the foregoing description. Accordingly, it is intended to embrace those alternatives, modifications, and variations as fall within the broad scope of the appended claims.

What is claimed is:

1. A metallic coating for providing oxidation and fatigue resistance having a composition consisting of up to 18 wt % cobalt, 3.0 to 18 wt % chromium, 5.0 to 15 wt % aluminum, 0.1 to 1.0 wt % yttrium, up to 0.6 wt % hafnium, from 0.001 to 0.3 wt % silicon, 3.0 to 10 wt % tantalum, from 0.001 to 9.0 wt % tungsten, 1.0 to 6.0 wt % rhenium, up to 10 wt % molybdenum, and the balance nickel.

2. A metallic coating according to claim 1, wherein a total amount of said tantalum and said tungsten is in a range of from more than 3.0 to 16.0 wt %.

3. A metallic coating according to claim 1, wherein said cobalt is present in an amount less than 15 wt %.

4. A metallic coating according to claim 1, wherein said chromium is present in an amount from 5.0 to 18 wt %.

5. A metallic coating according to claim 1, wherein said aluminum is present in an amount from 5.0 to 12 wt %.

6. A metallic coating according to claim 1, wherein said tungsten is present in an amount less than 5.0 wt %.

7. A metallic coating according to claim 1, wherein said cobalt is present in an amount from 2.0 to 18 wt %.

8. A metallic coating according to claim 1, wherein said chromium is present in an amount from 3.0 to 10 wt %.

9. A metallic coating according to claim 1, wherein said aluminum is present in an amount from 5.5 to 15 wt %.

10. A metallic coating according to claim 1, wherein said rhenium is present in an amount from 1.0 to 5.0 wt %.

11. A metallic coating according to claim 1, wherein said molybdenum is present in an amount from 0.2 to 4.0 wt %.

12. A metallic coating according to claim 1, wherein a total amount of said tantalum and said tungsten is in a range from 4.0 to 16 wt %.

13. A metallic coating consisting essentially of 2.0 to 18 wt % cobalt, 3.0 to 10 wt % chromium, 5.5 to 15 wt % aluminum, 0.1 to 1.0 wt % yttrium, up to 0.6 wt % hafnium, from 0.001 to 0.3 wt % silicon, 3.0 to 10 wt % tantalum, 1.0 to 9.0 wt % tungsten, 1.0 to 5.0 wt % rhenium, 0.2 to 4.0 wt % molybdenum, and the balance nickel.

14. A metallic coating according to claim 13, wherein said tantalum and said tungsten are present in a total amount in the range of from 4.0 to 16 wt %.

15. A metallic coating according to claim 13, wherein said tantalum and said tungsten are present in a total amount in the range of from 7.0 to 12 wt %.

16. A metallic coating according to claim 13, wherein said tantalum and said tungsten are present in a total amount of 11 wt %.

17. A metallic coating according to claim 13, wherein said cobalt is present in an amount from 8.0 to 12 wt %.

18. A metallic coating according to claim 13, wherein said chromium is present in an amount from 4.0 to 6.5 wt %.

19. A metallic coating according to claim 13, wherein said chromium is present in an amount of 5.0 wt %.

20. A metallic coating according to claim 13, wherein said yttrium is present in an amount from 0.2 to 0.7 wt %.

21. A metallic coating according to claim 13, wherein said yttrium is present in an amount from 0.4 to 0.7 wt %.

22. A metallic coating according to claim 13, wherein said hafnium is present in an amount from 0.2 to 0.6 wt %.

23. A metallic coating according to claim 13, wherein said hafnium is present in an amount of 0.4 wt %.

24. A metallic coating according to claim 13, wherein said silicon is present in an amount no greater than 0.1 wt %.

25. A metallic coating according to claim 13, wherein tantalum is present in an amount of 6.0 wt %.

26. A metallic coating according to claim 13, wherein said tungsten is present in an amount from 4.2 to 5.8 wt %.

27. A metallic coating according to claim 13, wherein said tungsten is present in an amount of 5.0 wt %.

28. A metallic coating according to claim 13, wherein said rhenium is present in an amount from 2.3 to 3.7 wt %.

29. A metallic coating according to claim 13, wherein said rhenium is present in amount of 3.0 wt %.

30. A metallic coating according to claim 13, wherein said molybdenum is present in an amount from 1.4 to 2.0 wt %.

31. A metallic coating according to claim 13, wherein said molybdenum is present in an amount of 1.7 wt %.

32. A method for depositing an overlay coating on a substrate comprising:
   providing a substrate material formed from at least one of a nickel-based, a cobalt-based, and an iron-based metallic material; and
   depositing onto said substrate a coating having a composition consisting essentially of up to 18 wt % cobalt, 3.0 to 18 wt % chromium, 5.0 to 15 wt % aluminum, 0.1 to 1.0 wt % yttrium, up to 0.6 wt % hafnium, up to 0.3 wt % silicon, 3.0 to 10 wt % tantalum, up to 9.0 wt % tungsten, 1.0 to 6.0 wt % rhenium, up to 10 wt % molybdenum, and the balance nickel.

33. A method for depositing an overlay coating according to claim 32, wherein said deposition step is carried out using a cathodic arc process.

34. A method according to claim 32, wherein said deposition step is carried out using a low pressure plasma spray technique.

35. A method according to claim 32, wherein said depositing step comprises depositing a coating having a composition consisting of up to 15 wt % cobalt, 5.0 to 18 wt % chromium, 5.0 to 12 wt % aluminum, 0.1 to 1.0 wt % yttrium, up to 0.6 wt % hafnium, up to 0.3 wt % silicon, 3.0 to 10 wt % tantalum, up to 5.0 wt % tungsten, 1.0 to 6.0 wt % rhenium, up to 10 wt % molybdenum, and the balance nickel.

36. A method according to claim 32, wherein said depositing step comprises depositing a coating having a composition consisting of up to 2.0 wt % cobalt, 10 to 15 wt % chromium, 6.0 to 10 wt % aluminum, 0.2 to 0.7 wt % yttrium, 0.2 to 0.6 wt % hafnium, up to 0.1 wt % silicon, 5.0 to 7.0 wt % tantalum, 1.0 to 4.0 wt % tungsten, 1.0 to 3.5 wt % rhenium, up to 4.0 wt % molybdenum, and the balance nickel.

37. A method according to claim 32, wherein said depositing step comprises depositing a coating having a composition consisting of 2.0 to 18 wt % cobalt, 3.0 to 10 wt % chromium, 5.5 to 15 wt % aluminum, 0.1 to 1.0 wt % yttrium, up to 0.6 wt % hafnium, up to 0.3 wt % silicon, 3.0 to 10 wt % tantalum, 1.0 to 9.0 wt % tungsten, 1.0 to 5.0 wt % rhenium, 0.2 to 4.0 wt % molybdenum, and the balance nickel.

38. A method according to claim 32, wherein said depositing step comprises depositing a coating having a composition consisting of 8.0 to 12 wt % cobalt, 4.0 to 6.5 wt % chromium, 7.5 to 12.5 wt % aluminum, 0.2 to 0.7 wt % yttrium, 0.2 to 0.6 wt % hafnium, up to 0.3 wt % silicon, 5.0 to 7.0 wt % tantalum, 4.2 to 5.8 wt % tungsten, 2.3 to 3.7 wt % rhenium, 1.4 to 2.0 wt % molybdenum, and the balance nickel.

* * * * *

UNITED STATES PATENT AND TRADEMARK OFFICE
CERTIFICATE OF CORRECTION

PATENT NO. : 7,361,302 B2 Page 1 of 1
APPLICATION NO. : 10/940233
DATED : April 22, 2008
INVENTOR(S) : Russell A. Beers et al.

It is certified that error appears in the above-identified patent and that said Letters Patent is hereby corrected as shown below:

In column 4, claim 13, line 47, delete "essentially".

In column 5, claim 32, line 31, delete "essentially".

Signed and Sealed this

Ninth Day of September, 2008

JON W. DUDAS
*Director of the United States Patent and Trademark Office*